United States Patent
Self et al.

(10) Patent No.: US 7,094,063 B1
(45) Date of Patent: Aug. 22, 2006

(54) HIGH DENSITY INTERCONNECT

(75) Inventors: Bob J. Self, Colorado Springs, CO (US); Donald M. Logelin, Colorado Springs, CO (US); Robert H. Wardwell, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/835,718

(22) Filed: Apr. 30, 2004

(51) Int. Cl.
*H01R 12/00* (2006.01)

(52) U.S. Cl. .......................................... 439/66; 439/67
(58) Field of Classification Search .................. 439/66, 439/67, 91, 591
See application file for complete search history.

(56) References Cited

U.S. PATENT DOCUMENTS

| | | |
|---|---|---|
| 5,759,047 A | 6/1998 | Brodsky et al. |
| 6,005,777 A | 12/1999 | Bloom et al. |
| 6,024,579 A | 2/2000 | Bennett |
| 6,196,852 B1 | 3/2001 | Neumann et al. |
| 6,200,141 B1 | 3/2001 | Sinclair |
| 6,205,660 B1 | 3/2001 | Fjelstad et al. |
| 6,274,820 B1 * | 8/2001 | DiStefano et al. .......... 174/254 |
| 6,524,115 B1 | 2/2003 | Gates et al. |
| 2003/0003779 A1 | 1/2003 | Rathburn |

* cited by examiner

*Primary Examiner*—Khiem Nguyen

(57) ABSTRACT

An interconnect formed using a stiff layer having a plurality of holes extending there through. A first flexible layer is bonded to a first side of the stiff layer. The first flexible layer having a plurality of conductive bumps, each conductive bump being positioned over a hole. A second flexible layer is bonded to a second side of the stiff layer. The second flexible layer having a plurality of conductive bumps, each conductive bump being positioned over a hole. Signal paths are formed in the holes, the signal paths connecting the plurality of conductive bumps on the first layer to the plurality of conductive bumps on the second layer.

16 Claims, 9 Drawing Sheets

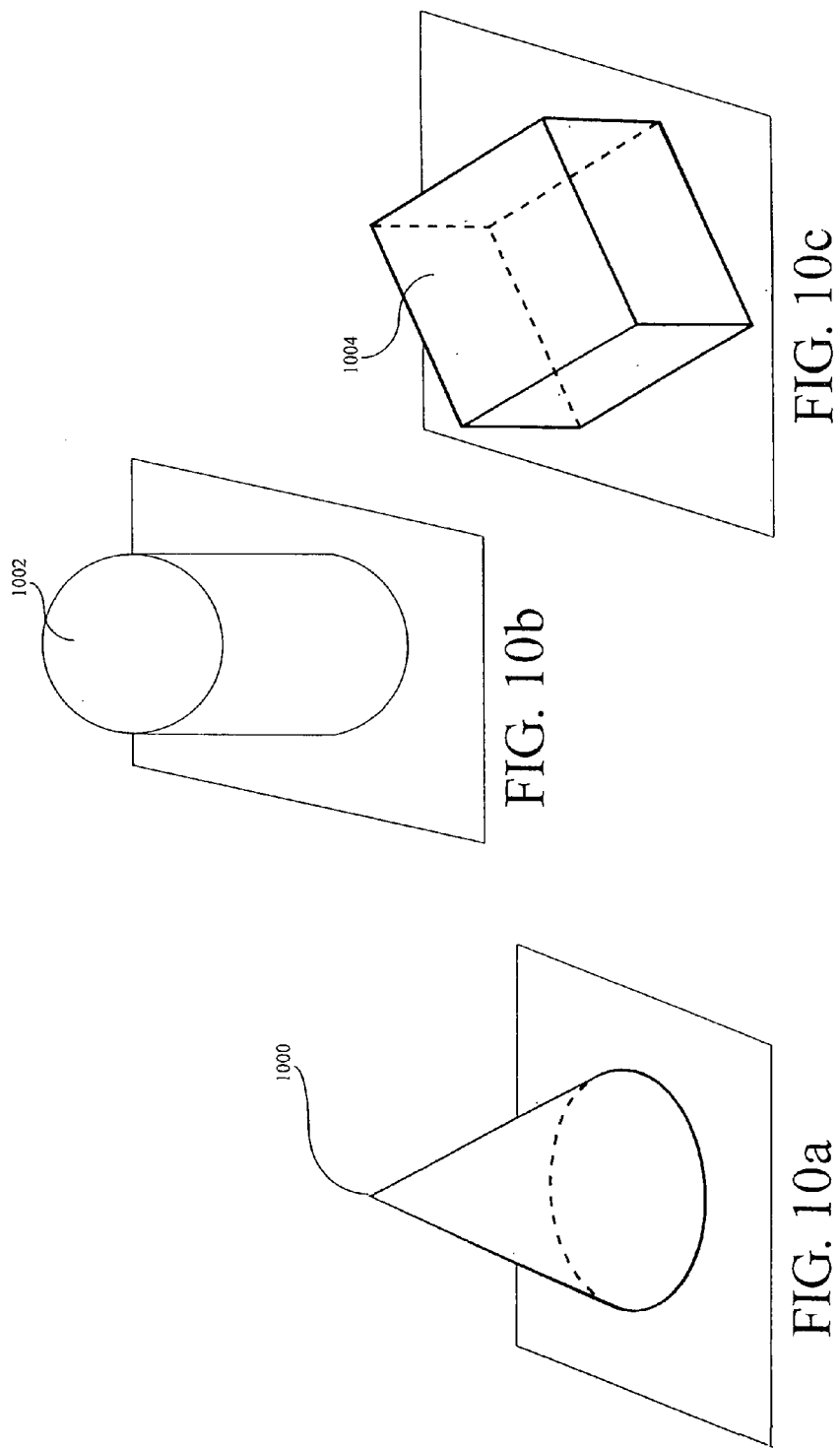

HIGH DENSITY INTERCONNECT

CROSS REFERENCE TO RELATED APPLICATIONS

This Application claims the benefit under 35 U.S.C. § 120 of earlier filed U.S. patent application Ser. No. 10/232,800 filed on Aug. 30, 2002.

BACKGROUND OF THE INVENTION

Many test and measurement devices, including logic analysis systems and probes, require the use of a high density interconnect to interface with a device under test. In the case of a logic analysis probe that tests circuits secured by, for example a ball grid array, it is not unusual for a logic analysis probe to use an interconnect having a 49×49 array of connections to connect the probe to the board under test. Such interconnects have a total of 2,401 connections. Many current interconnects are of the so-called "bed of nails" variety that is clamped over a matrix of lands, for example to the rear of a ball grid array, formed on a board under test. In this configuration, the connections (e.g. the nails) match with the lands on the board. Known interconnects of this configuration require a clamping force of 40 to 60 grams per contact meaning that over 96 Kilograms (up to 144 Kilograms) of clamping force is required. Other known types of interconnects include socketing and a variety of board to board interconnects most of which have similar clamping requirements.

Examples of known interconnects include those produced by INTERCON SYSTEMS, SHINETSU, TYCO, TELEDYNE, and PARACON for use with their respective probe offerings. The probes provided by such producers often include additional circuitry to perform specialized functions including: pin translation, termination, and compensation. In these probes, the additional circuitry is either added to the test and measurement unit or embedded in an additional structure associated with the cable. While useful, such additional circuitry would benefit from being integrated with the interconnect. Such integration would lead to decreased loads and reduced stub lengths.

Accordingly, the present inventors have recognized a need for interconnects that reduce the required clamping force while providing for integrated circuitry.

BRIEF DESCRIPTION OF THE DRAWINGS

An understanding of the present invention can be gained from the following detailed description of the invention, taken in conjunction with the accompanying drawings of which:

FIGS. 10a through 10c are diagrams of various bumplett shapes.

DETAILED DESCRIPTION

Figure 1:
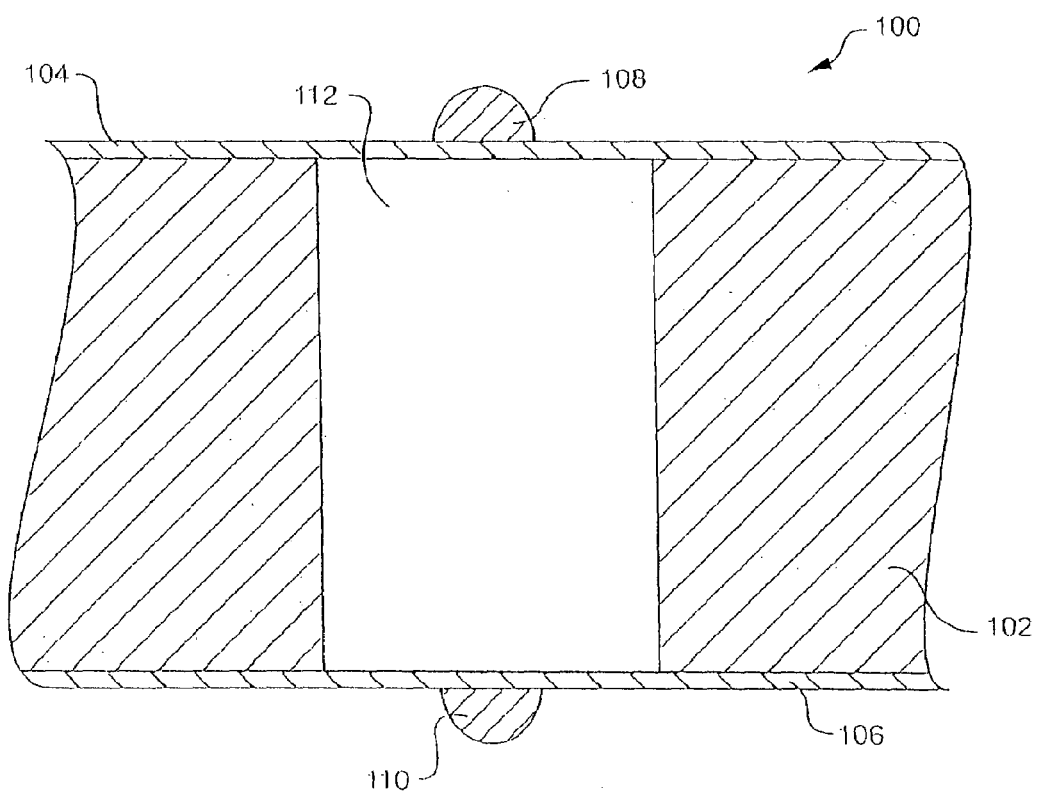
FIG. 1 is a cross-sectional view of a connection in accordance with a preferred embodiment of the present invention.

Reference will now be made in detail to the present invention, examples of which are illustrated in the accompanying drawings, wherein like reference numerals refer to like elements throughout.

FIG. 1 is a cross-sectional view of a connection 100 in accordance with a preferred embodiment of the present invention. It will be appreciated by those of ordinary skill in the relevant arts that the connectors, for example connection 100, as illustrated and described herein, and the operation thereof as described hereinafter are intended to be generally representative such connections and that any particular connection may differ significantly from that shown in the drawings, particularly in the details of construction of such connection, while still falling within the scope of the invention. As such, the connections described herein are to be regarded as illustrative and exemplary and not limiting as regards the invention described herein or the claims attached hereto.

The connection 100 is formed on a printed circuit board (PCB) 102, comprising for example FR-4 ("Flame Retardant" woven glass reinforced epoxy resin). Flexible layers 104 and 106 are bonded to a first and second side of the PCB 102. The flexible layers are preferably formed of CAPTON and act, in effect, as flexible circuit boards. A pair of conductive bumps 108 and 110 are formed on the flexible layers 104 and 106, respectively, over a hole 112 in the PCB 102. The bumps 108 and 110 are preferably formed of gold, but any suitable conductive material may be used such as copper. The bumps 108 and 110 are connected using vias (not shown in FIG. 1) formed to electrically connect the flexible layers 104 and 106 through the PCB 102. Usually, but not always, vias are formed by drilling a hole through the PCB 102 and the flexible layers 104 and 106 and depositing conductive material, such as gold or copper, into the hole.

Figure 2:
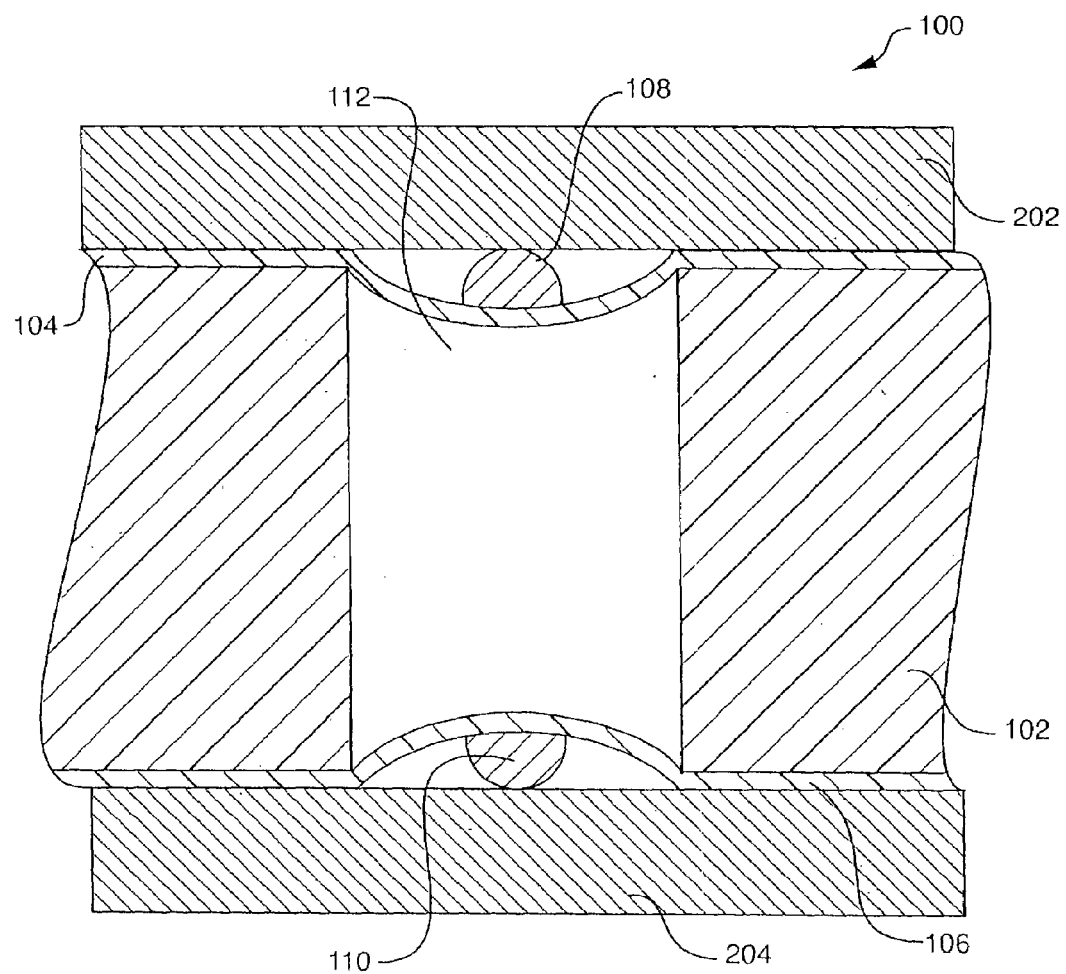
FIG. 2 is a cross-sectional view of a connection, as shown in FIG. 1, in situ in accordance with a preferred embodiment of the present invention

FIG. 2 is a cross-sectional view of the connection 100, as shown in FIG. 1, in situ in accordance with a preferred embodiment of the present invention. More specifically, FIG. 2, shows the connection 100 interposed between a first board 202 (for example a connector on a probe) and a second board 204 (for example a circuit under test). The flexible layers 104 and 106 are flexed toward the center of the PCB 102 into the hole 112. It is anticipated that the clamping force required will be in the range of 20 to 25 grams per connector. Thus, in a 49×49 array of 2,401 connections no more that 60 Kilograms of clamping force should be required.

Figure 3:
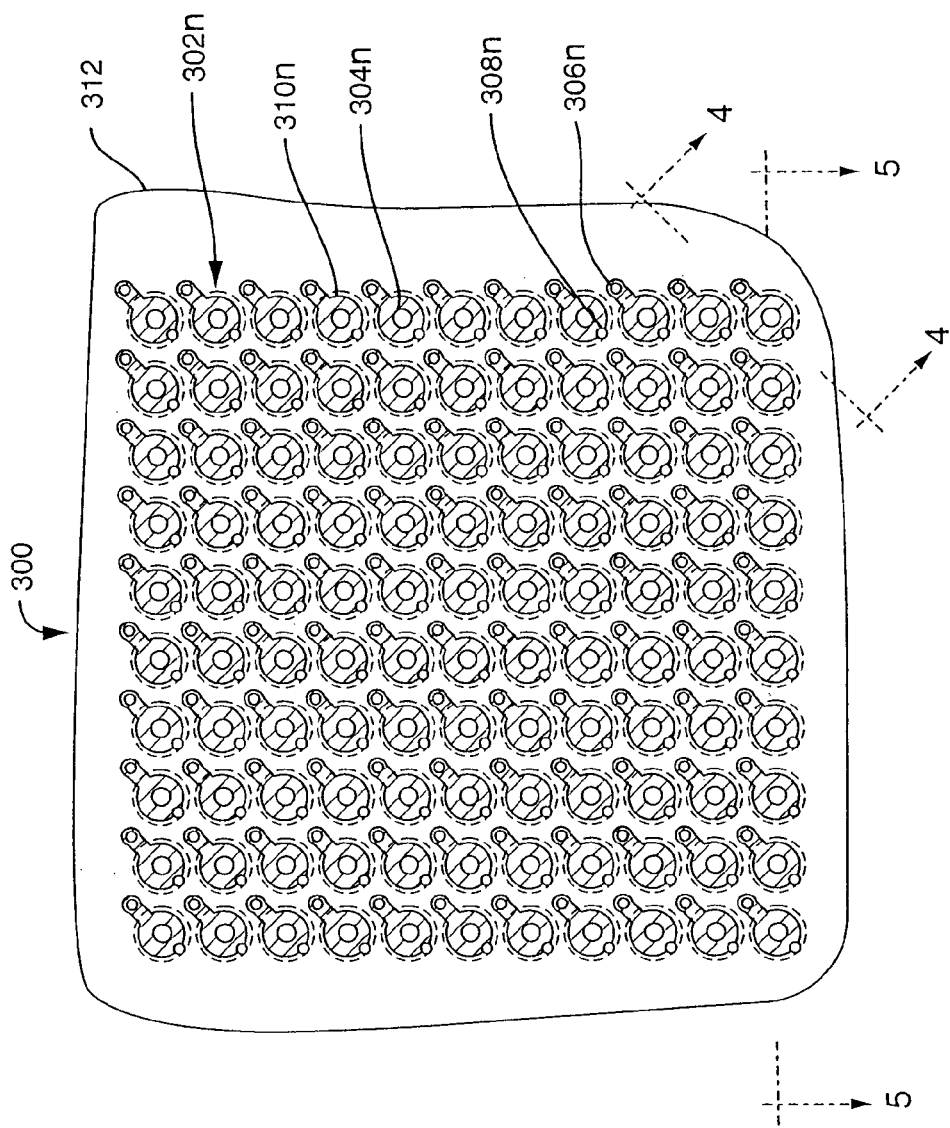
FIG. 3 is a plan view of an interconnect in accordance with a preferred embodiment of the present invention.

FIG. 3 is a plan view of an interconnect 300 in accordance with a preferred embodiment of the present invention. FIG. 3 shows an 11×11 array of connections 302n. Each connection comprises conductive bumps 304n (along with opposing bumps on the other side of the interconnect 300—not shown), vias 306n, and vents 308n. The vias 306n are connected to the bumps 304n by tracings 310 n on the flexible layer 312. The opposing bumps 320n (see FIGS. 4 and 5) are similarly connected with tracing on the flexible layer 318 (see FIGS. 4 and 5). The vias 306n are preferably placed at 45 degrees to the grid of bumps 302n to allow for more efficient packing. It should be noted that it is possible, and maybe even desirable, to coat the hole 314n (see FIG. 4) with a conductor thereby forgoing the need for a separate signal feed 306n (refer to FIGS. 7 through 9 and the associated description hereinafter).

The vents 308n are provided to allow gas to escape the holes 112 during fabrication of the interconnect 300 and during compression in use. Depending on the fabrication method, the vent holes 308n may not be required.

Figure 4:
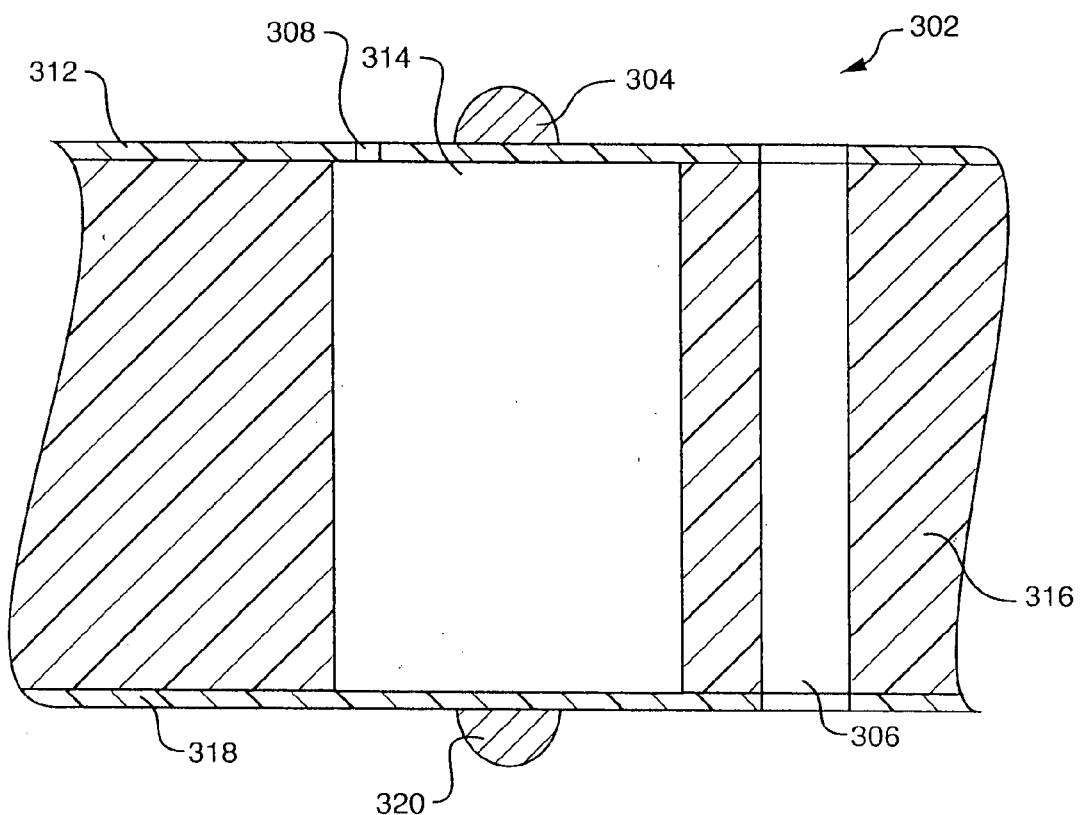
FIG. 4 is a cross-sectional view of a connection, in accordance with a preferred embodiment of the present invention, taken along line 4—4 in FIG. 3.

FIG. 4 is a cross-sectional view of a connection 302, in accordance with a preferred embodiment of the present invention, taken along line 4—4 in FIG. 3. As set forth above, the connection 302 is formed on a PCB 316 layered with flexible layers 312 and 318. Bumps 304 and 320 are deposited on the flexible layers 312 & 318, respectively, over the hole 314. A via 306 electrically connects the bumps 304 and 320. A vent 308 (optional) is provided on the flexible layer 312 to permit gas to escape from the hole 314. Those of ordinary skill in the art will recognize that FIG. 4 shows one possible orientation of via 306, hole 314, and vent 308.

Figure 5:
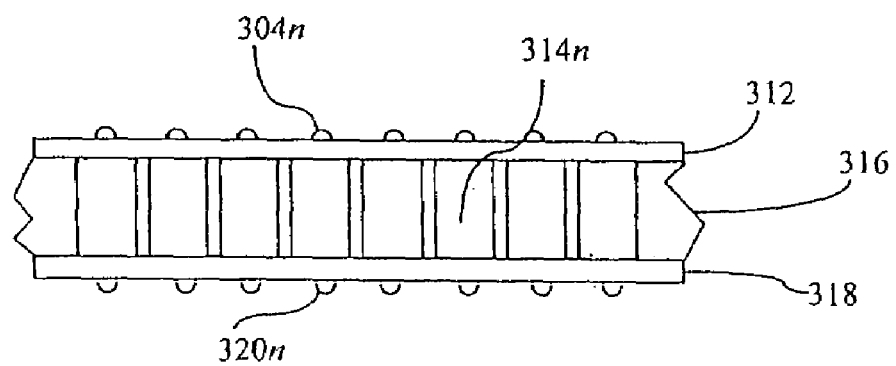
FIG. 5 is a cross-sectional view of an interconnect, in accordance with a preferred embodiment of the present invention, taken along line 5—5 in FIG. 3.

FIG. 5 is a cross-sectional view of the interconnect 300, in accordance with a preferred embodiment of the present invention, taken along line 5—5 in FIG. 3. The pitch between adjacent bumps 304n and/or adjacent bumps 320n may be adjusted to match the circuit under test, but could be as close as 1.00 mm or less.

One process for the creation of an interconnect in accordance with the preferred embodiments of the present invention is set forth hereinafter. The process uses the following materials: sheet adhesive (such as the Dupont AP series); Capton (such as the Dupont LF series); PCB (such as Isola FR4); Dry Film Resist; and Silver Halide Film.

1. Shear adhesive, Capton and PCB materials relative to lamination plate dimensions.
2. Clean materials from step #1.
3. Set the adhesive and Capton materials aside in a desiccant chamber.
4. Drill air gap vias and tooling in PCB to specifications.
5. Coat Drilled PCB material with Dry Film Resist.
6. Photoplot and develop to provide targeting coupon information relative to drilled holes on the PCB material.
7. Using the Silver Halide Film, eye registered them to the drilling in the PCB material.
8. Print resist coated PCB.
9. Develop the resist coated PCB material.
10. Etch resist coated PCB material.
11. Strip resist coated PCB material.
12. Punch tooling holes in adhesive and Capton materials.
13. Place adhesive and PCB materials in Plasma Etch at 225° F. for 1 hour then plasma using Flex Press Prep Cycle.
14. Layup adhesive, Capton and PCB materials along with all other pertinent pressing materials.
15. Press at desired temperature followed by a 30 min cooling cycle under high pressure.
16. Drill conduction vias in panel with respect to etched targeting pattern.
17. Plate thru panel in conduction vias.
18. Panel plate the plated thru panel to a copper deposition thickness in the conduction vias.
19. Coat panel with Electrophoretic Resist.
20. Photoplot and develop according to specified artwork to provide land pads relative to drilled holes on the PCB material.
21. Using the Silver Halide Films, eye registered them to the drilling in the panel.
22. Print resist coated panel with Silver Halide films.
23. Develop resist-coated panel.
24. Etch resist-coated panel.
25. Strip resist coated panel.
26. Coat panel with 3 layers of Dry Film Resist.
27. Photoplot and develop according to specified artwork to provide plating image relative the land pads etched on the panel.
28. Using the Silver Halide Films, eye registered them to the land pads on the panel.
29. Print resist-coated panel.
30. Develop resist-coated panel.
31. Electroplate copper "Bumps" on the resist-coated panel at the relevant length of time, preferably at very low current.
32. Strip resist coated panel.
33. Coat panel with Dry Film Resist.
34. Photoplot and develop according to specified artwork to provide a post gold etch resist relative to the etched land pads on the panel.
35. Using the Silver Halide Films, eye registered them to the land pads.
36. Print resist coated panel with Silver Halide films.
37. Develop resist-coated panel.
38. Electrolytic Gold/Nickel-plate (Subcontract) with 25 uin of Gold over 250 uin of Nickel.
39. Strip resist coated panel.
40. Etch panel.
41. Final Route "Bump" boards from panel according to specified artwork and tolerances.

Although a few embodiments of the present invention have been shown and described, it would be appreciated by those skilled in the art that changes may be made in these embodiments without departing from the principles and spirit of the invention, the scope of which is defined in the claims and their equivalents. For example, the PCB 102 can be configured as a multi-layer circuit to facilitate pin translation. Also, while the printed circuit board 102 is described as having holes 112 which extend through the PCB 102, those of ordinary skill in the art will recognize that the holes 112 need not extend through the board. The holes 112, but need only be deep enough to contain the portions of the flexible layers (104 and 106) and the bumps (108 and 110) that are displaced when the interconnect 300 is in use. In such a configuration, it would be possible to use the non-perforated middle of the PCB as a signal layer for re-routing signals between bumps. It is also envisioned that other structures can be utilized instead of the PCB 102. Most any stiff structure, such as any number of ceramics, capable of bonding to the flexible layers 104 and 106 could be utilized.

One advantage of the present invention is that it facilitates the embedding of additional circuit components, such as resistors and capacitors to perform specialized functions, including pin translation, termination, and compensation. Such components can be incorporated by embedding them in the signal paths 306n of PCB 102, mounted on the flexible layers 312 and 318, or mounted to the PCB 316. Pin translation can be implemented by, for example, opening selected signal paths 306n or re-routing the tracings 310n.

Figure 6:
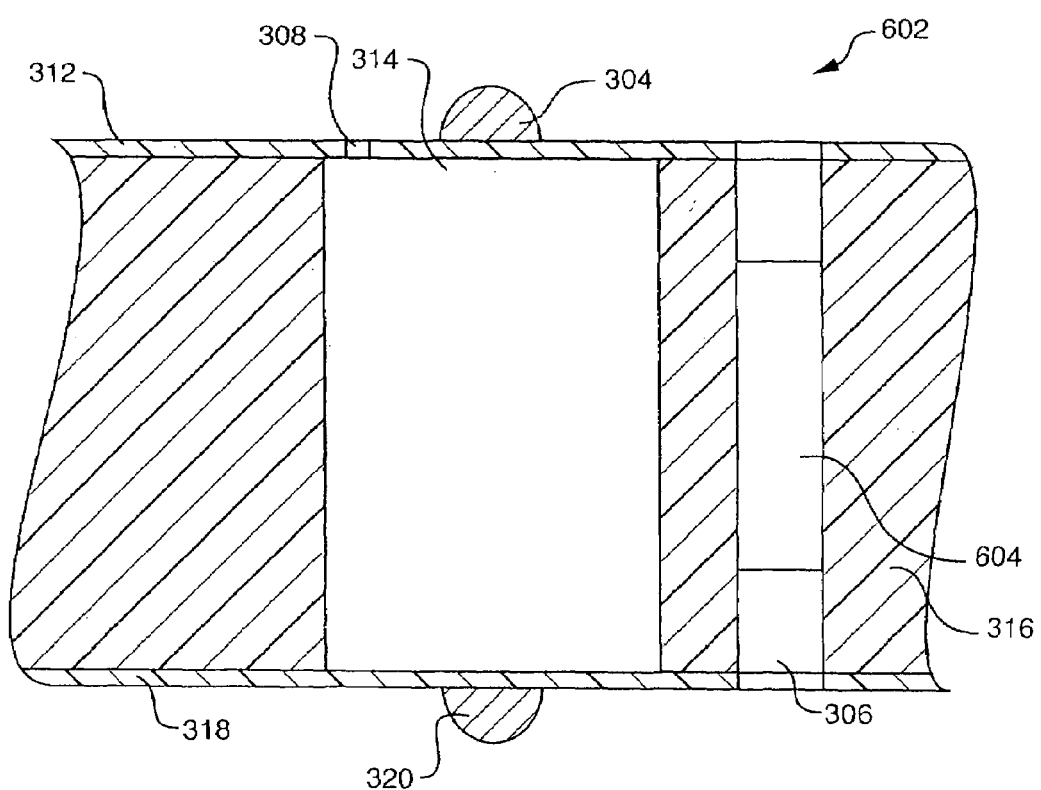
FIG. 6 is a cross-sectional view of a connection in accordance with another preferred embodiment of the present invention.

FIG. 6 is a cross-sectional view of a connector 602 in accordance with another preferred embodiment of the present invention taken along line A—A in FIG. 3. FIG. 6 illustrates the embedding of components component(s) 604 in vias 306n. The present invention is particularly suited for the embedding of components comprising: resistors (R); capacitors (C); and inductors (L). R, RC, and RCR networks may be formed and embedded into PCB 316 or surface mounted onto the PCB 316, the flexible layer 312 or the flexible layer 318.

Component(s) 604 can be embedded by placing the component, or components, into the holes used to form vias 306n, as in the previous description, and then filing the hole with solder. It may be desirable to select the thickness of the PCB102 to match that of the component to facilitate economical assembly. The use of a ceramic board instead of the PCB 316 may facilitate embedding.

Figure 7:
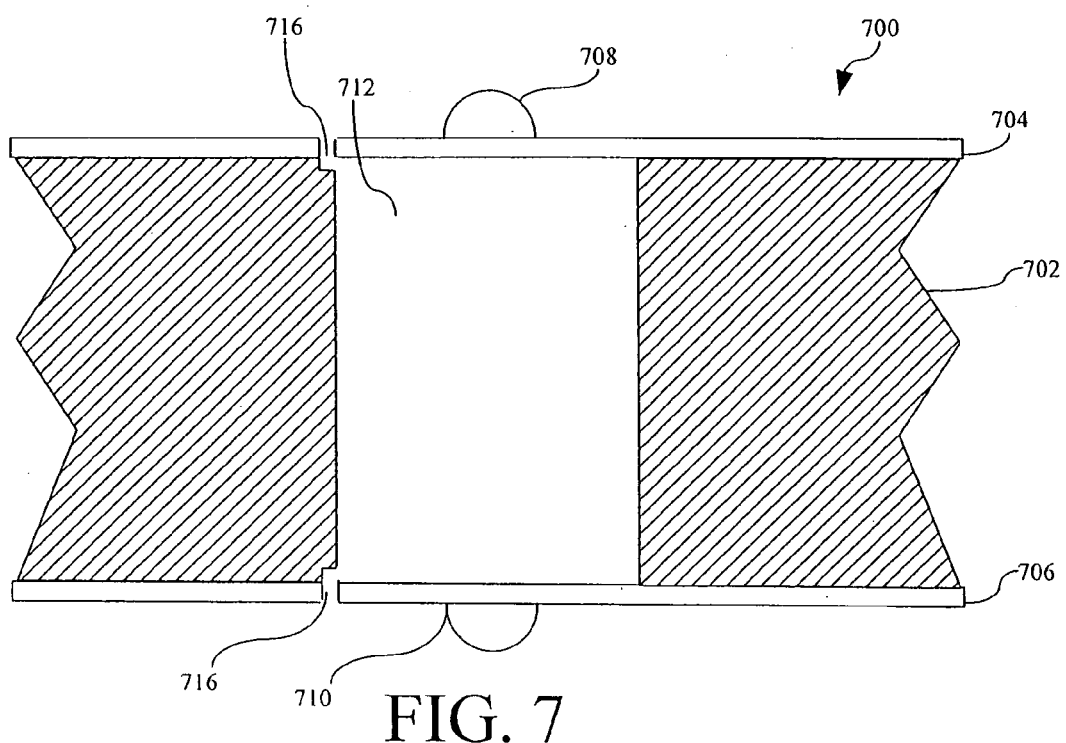
FIG. 7 is a cross-sectional view of a connection in accordance with a preferred embodiment of the present invention.

FIG. 7 is a cross-sectional view of a connection 700 in accordance with a preferred embodiment of the present invention. The connection 700 is formed on a printed circuit board (PCB) 702, comprising for example FR-4 ("Flame Retardant" woven glass reinforced epoxy resin). Flexible layers 704 and 706 are bonded to a first and second side of the PCB 702. The flexible layers are preferably formed of CAPTON and act, in effect, as flexible circuit boards. A pair of conductive bumps 708 and 710 are formed on the flexible layers 704 and 706, respectively, over a hole 712 in the PCB 702. The bumps 708 and 710 are preferably formed of gold, but any suitable conductive material may be used such as copper.

The inner wall 714 of the hole 712 is coated with conductive material such as copper or gold, using for example a deposition process. The bumps 708 and 710 are connected to the gold coating on the inner wall 714 using blind micro vias 716 situated just above the edge of the inner wall 714. Blind vias are via holes which are formed to connect the outer circuit with inner layers, but do not go through the entire board. In this case, the vias 116 extends through the flexible layers 704–706 and into PCB 702 just enough to ensure an adequate electrical connection.

Micro vias comprise a small (typically 0.002"–0.004") hole that connects the outer surface of a layer, in this case one of the flexible layers, to the inner surface thereof. Current micro via formation options for flex circuits include mechanical drilling, small-hole punching, laser drilling, plasma etching, chemical etching and the photopolymer process. If desired, multiple blind micro vias 716 may be provided for each bump 708 and 710. Further, if desired vents (not shown) may be provided to allow gas to escape the holes 712 during fabrication of the interconnect 700 and during compression in use.

Figure 8:
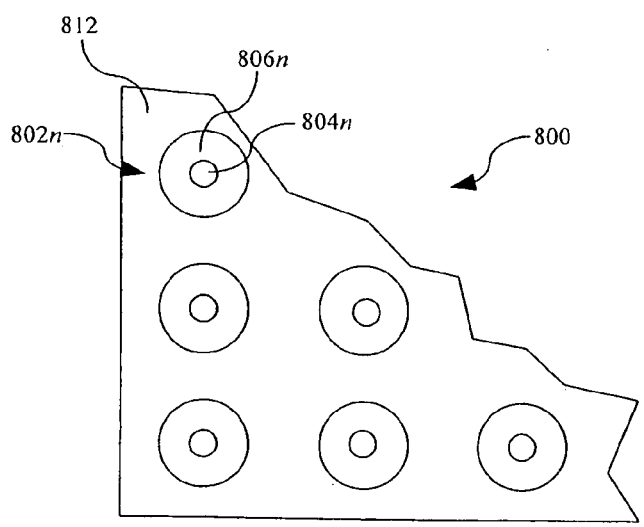
FIG. 8 is a partial plan view of an interconnect in accordance with a preferred embodiment of the present invention.

FIG. 8 is a plan view of an interconnect 800 in accordance with a preferred embodiment of the present invention. FIG. 8 shows a portion of, for example an 11×11 array of connections 802n. Each connection comprises conductive bumps 804n (along with opposing bumps on the other side of the interconnect 800—not shown), situated over vias 806. The micro vias not shown are connected to the bumps 304n by tracings on the flexible layer 812. The opposing bumps (not shown) are similarly connected with tracing on the opposing flexible layer 818 (also not shown).

Figure 9:
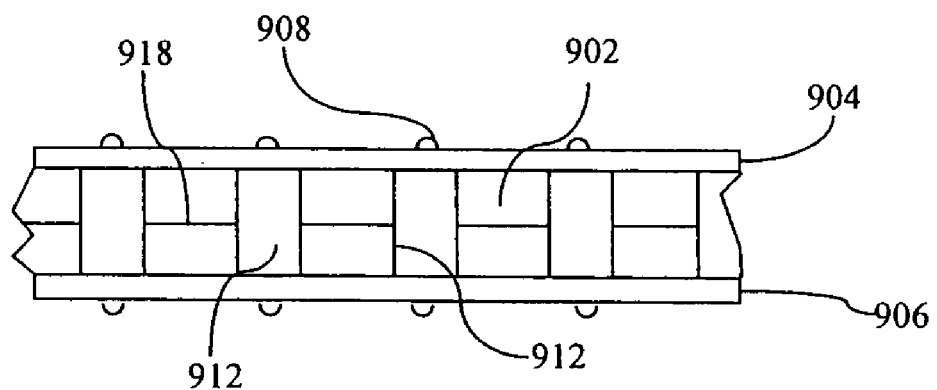
FIG. 9 partial cross sectional view of an interconnect in accordance with a preferred embodiment of the present invention.

FIG. 9 is a partial cross-sectional view of a interconnect 900 in accordance with a preferred embodiment of the present invention. The interconnect 900 is formed on a multi level printed circuit board (PCB) 902. The PCB 902 includes at least one ground plane 918, formed for example of copper, situated between two layers 912a and 912b. The layers 912a and 912b preferably comprising FR-4. The ground plane 918 reduces inductance (ground bounce) and signal-to-signal coupling. While not shown, it may be desirable to utilize multiple ground planes depending on the performance level required. In accordance with a preferred embodiment the ground plane 918 is grounded to the ground pin(s) on the circuits being connected, generally a probe and a device under test. In the configuration shown in FIG. 9, this is accomplished by permitting ground plane 918 to extend to the wall of 914 of the hole 912 corresponding to the ground signal. In this case the conductive coating on the wall 914 will electrically connect to the ground plane 918. For all other holes 912, the ground plane 918 will be electrically isolated. Alternatively, in the case where control of the location of the ground plane is not exercised, an insulating coating can be applied to the all 914 of each non-ground hole 912 prior to the application of the conductive layer.

Flexible layers 904 and 906 are bonded to a first and second side of the PCB 902. A pair of conductive bumps 908 and 910 are formed on the flexible layers 904 and 906, respectively, over a hole 912 in the PCB 902. In the example shown in FIG. 9, the bump interconnection configuration first shown in FIG. 7 is adopted. Specifically, the inner wall 914 of the hole 912 is coated with conductive material such as copper or gold, using for example a deposition process. The bumps 908 and 910 are connected to the gold coating on the inner wall 914 using micro vias 916. It may also prove desirable to modify the connection shown in FIG. 9 to adopt the bump interconnection configuration shown in FIGS. 3 though 6 by using a via separate from the hole 914 to electrically connect the bumps 908 and 910.

FIGS. 10a through 10b are diagrams of various shapes that may be desirable to adopt for the bumps of the present invention. While the bumps shown in foregoing FIGS. 1 through 9 are shown as being spherical, it may be preferable to form the bumps in a substantially conical, columnar, or cubical shape. Accordingly, FIG. 10a is an illustration of a conical bump 1000; FIG. 10b, is an illustration of a columnar bump 1002; and FIG. 10c is an illustration of a cubical bump 1004. It is important to note that the degree to which the bumps conform to the exact shape recited is heavily dependant upon the formation process and some round of the edges, points and other deformations are to be expected.

What is claimed is:

1. An interconnect comprising:
   a stiff layer having a plurality of holes extending there through;
   a first flexible layer bonded to a first side of the stiff layer, the first flexible layer having a plurality of conductive bumps, each conductive bump being positioned over a hole;
   a second flexible layer bonded to a second side of the stiff layer, the second flexible layer having a plurality of conductive bumps, each conductive bump being positioned over a hole; and
   signal paths formed in the holes, the signal paths connecting the plurality of conductive bumps on the first layer to the plurality of conductive bumps on the second layer.

2. An interconnect, as set forth in claim 1, wherein the stiff layer comprises a multilayer printed circuit board with an embedded ground plane.

3. An interconnect, as set forth in claim 1, wherein the stiff layer comprises a multilayer printed circuit board with a plurality of embedded ground planes.

4. An interconnect, as set forth in claim 1, wherein each signal path comprises an electrically conductive material bonded td an inner wall of the hole.

5. An interconnect, as set forth in claim 4, wherein each signal path further comprises blind micro vias extending through the first and second flexible layers connecting associated bumps with the electrically conductive material bonded to an inner wall of the hole.

6. An interconnect, as set forth in claim 1, wherein the first and second flexible layers comprise flexible circuit boards.

7. An interconnect, as set forth in claim 1, wherein the plurality of conductive bumps have one of a conical, columnar, or cubical shape.

8. An interconnect, as set forth in claim 1, wherein the plurality of bumps on the first flexible surface have a pitch of 1.0 mm or less.

9. An interconnect, as set forth in claim 1, wherein the plurality of bumps on the first flexible surface have a pitch of less than 2.0 mm.

10. An interconnect, as set forth in claim 1, wherein the plurality of bumps on the first flexible surface have a pitch of less than 5.0 mm.

11. An interconnect, as set forth in claim 1, wherein each signal path comprises:
conductive material bonded to an inner wall of the hole;
a first via extending through the first flexible layer over the edge of the hole, the via being electrically connected to the conductive material bonded to an inner wall of the hole;
a second via extending though the second flexible layer over the edge of the hole, the via being electrically connected to the conductive material bonded to an inner wall of the hole;
tracings on the first flexible layer connecting a conductive bumps to the first via; and
tracings on the second flexible layer connecting a conductive bumps to the second via.

12. An interconnect, as set forth in claim 11, wherein the signal paths further comprise:
a third via extending through the first flexible layer over the edge of the hole, the via being electrically connected to the conductive material bonded to an inner wall of the hole;
a fourth via extending though the second flexible layer over the edge of the hole, the via being electrically connected to the conductive material bonded to an inner wall of the hole; and
wherein the tracings on the first flexible layer connecting the conductive bumps to the third via and the tracings on the second flexible layer connecting the conductive bumps to the fourth via.

13. An interconnect comprising:
a stiff layer having a plurality of holes therein;
a ground plane embedded in the stiff layer;
a first flexible layer bonded to a first side of the stiff layer, the first flexible layer having a plurality of conductive bumps thereon positioned over holes;
a second flexible layer bonded to a second side of the stiff layer, the second flexible layer having a plurality of conductive bumps thereon positioned over holes; and
signal paths embedded in the stiff layer connecting the plurality of conductive bumps on the first layer to the plurality of conductive bumps on the second layer.

14. An interconnect comprising:
a stiff layer having a plurality of holes therein;
a conductive coating bonded to the walls of each of the plurality of holes;
a first flexible layer bonded to a first side of the stiff layer, the first flexible layer having a plurality of conductive bumps thereon positioned over the holes;
a second flexible layer bonded to a second side of the stiff layer, the second flexible layer having a plurality of conductive bumps thereon positioned over the holes forming a plurality of pairs of conductive bumps, each pair including one conductive bump on the first flexible layer and one conductive bump on the second conductive layer;
a plurality of vias, each via being associated with a conductive bump and extending through a respective first or second flexible layer through the stiff layer, each via being positioned over the wall of the hole associated with the associated conductive bump;
tracings on the first flexible layer connecting each conductive bump to an associated via;
tracings oh the second flexible layer connecting each conductive bump to an associated via; and
wherein the portions of the first and second flexible layers adjacent to the conductive bumps are displaced into the plurality of holes when the interconnect is sandwiched between two connectors.

15. An interconnect, as set forth n claim 14, Wherein the plurality of vias are blind micro vias.

16. An interconnect comprising:
a stiff layer having a plurality of holes therein;
a ground plane embedded in the stiff layer;
a first flexible layer bonded to a first side of the stiff layer, the first flexible layer having a plurality of conductive bumps thereon positioned over the holes;
a second flexible layer bonded to a second side of the stiff layer, the second flexible layer having a plurality of conductive bumps thereon positioned over the holes forming a plurality of pairs of conductive bumps, each pair including one conductive bump on the first flexible layer and one conductive bump on the second conductive layer;
a plurality of vias, each via extending from the first flexible layer through the stiff layer to the second flexible layer, each via being associated with a pair of conductive bumps;
tracings on the first flexible layer connecting each conductive bump to an associated via;
tracings on the second flexible layer connecting each conductive bump to an associated via; and
wherein the portions of the first and second flexible layers adjacent to the conductive bumps are displaced into the plurality of holes when the interconnect is sandwiched between two connectors.

* * * * *

UNITED STATES PATENT AND TRADEMARK OFFICE
CERTIFICATE OF CORRECTION

PATENT NO. : 7,094,063 B1
APPLICATION NO. : 10/835718
DATED : August 22, 2006
INVENTOR(S) : Self et al.

Page 1 of 1

It is certified that error appears in the above-identified patent and that said Letters Patent is hereby corrected as shown below:

Column 7, line 3, in Claim 4, delete "td" and insert -- to --, therefor.

Column 8, line 25, in Claim 14, delete "oh" and insert -- on --, therefor.

Column 8, line 32, in Claim 15, after "forth" delete "n" and insert -- in --, therefor.

Column 8, line 32, in Claim 15, delete "Wherein" and insert -- wherein --, therefor.

Signed and Sealed this

Second Day of January, 2007

JON W. DUDAS
*Director of the United States Patent and Trademark Office*